United States Patent [19]

Wine

[11] Patent Number: 4,601,060
[45] Date of Patent: Jul. 15, 1986

[54] AUTOMATIC DIGITAL FINE TUNING SYSTEM

[75] Inventor: Charles M. Wine, Princeton Borough, N.J.

[73] Assignee: RCA Corporation, Princeton, N.J.

[21] Appl. No.: 664,418

[22] Filed: Oct. 24, 1984

[51] Int. Cl.$^4$ .......................... H04B 1/26; H04N 5/50
[52] U.S. Cl. .................................. 455/192; 455/182;
455/265; 358/195.1
[58] Field of Search ............... 455/164, 182, 192, 260,
455/265; 358/195.1

[56] References Cited

U.S. PATENT DOCUMENTS

| | | |
|---|---|---|
| 3,821,650 | 6/1974 | Kase et al. . |
| 4,077,008 | 2/1978 | Rast et al. . |
| 4,118,740 | 10/1978 | Rypkema ...................... 358/195.1 |
| 4,320,533 | 3/1982 | Hashima . |
| 4,322,751 | 3/1982 | Hongu et al. .................. 358/195.1 |
| 4,485,404 | 11/1984 | Tults . |

OTHER PUBLICATIONS

"Philips Technical Information 034, TDA2540 and TDA2541 New Vision i.f. ICS", Philips Electronic Components and Materials.

Primary Examiner—Jin F. Ng
Attorney, Agent, or Firm—Paul J. Rasmussen; Peter M. Emanuel; Adel A. Ahmed

[57] ABSTRACT

In automatic fine tuning (AFT) apparatus in a superheterodyne receiver, the IF carrier is selectively filtered and is applied to a signal multiplier arrangement. An auxiliary heterodyning signal is also applied to the multiplier arrangement, so as to produce an offset signal having a frequency proportional to the frequency difference between the IF carrier and the heterodyning signal. The offset signal is applied to a microprocessor programmed to produce a control signal for controlling the local oscillator to reduce frequency deviation between the IF signal and a nominal IF frequency.

7 Claims, 4 Drawing Figures

AUTOMATIC DIGITAL FINE TUNING SYSTEM

The present invention pertains to the field of automatic fine tuning (AFT) apparatus for radio frequency (RF) receivers, including television receivers and the like.

In a superheterodyne receiver, AFT is generally accomplished by controlling the local oscillator frequency so as to position the intermediate frequency (IF) signal properly in the IF amplifier pass band. The signal for AFT control of the local oscillator frequency is commonly derived by measuring the frequency of an information bearing carrier of the IF signal, for example, by using a frequency discriminator. Analog AFT apparatus conventionally employed in television and radio receivers is usually associated with costly discrete circuitry comprising tuned circuits which need accurate alignment. Digital AFT apparatus is desirable because it makes possible to a great extent the elimination of the discrete circuitry and tuned circuits. Digital AFT apparatus is also desirable since it allows the incorporation of a significant portion of the circuitry in digital signal processing integrated circuits which are required for other portions of a receiver such as that for channel selection and other control functions.

Digital AFT apparatus in which the IF signal frequency is counted is subject to the problem of overmodulation in the IF signal, which can cause the effective carrier amplitude to become so low that a counter is unable to count it reliably. This may cause an interruption in the AFT process which, e.g., in a television receiver, may result in corresponding disturbances in the image and audio responses. The AFT process may also be disturbed by a false count resulting from impulse noise.

Another problem encountered in such digital AFT apparatus results from the relatively high frequency of the IF (in the United States, 45.75 MHz) which requires the use of relatively expensive prescaling or frequency dividing circuitry prior to the counting circuitry.

In accordance with an aspect of the present invention, digital AFT apparatus for a television receiver includes a multiplier coupled to receive a carrier representative signal corresponding to a filtered IF carrier signal and a locally generated heterodyning signal. These signals are combined to produce an offset signal having a frequency proportional to the difference frequency between the carrier representative signal and the heterodyning signal. A control means including a source of clock signal receives the offset signal and produces a control signal proportional to the difference frequency. The control signal is applied to the receiver local oscillator control input, in a sense to reduce frequency deviation between the IF signal and a predetermined nominal IF.

In accordance with a further aspect of the invention, providing particular advantage in case of implementation using an existing integrated circuit employing a multiplier for synchronously detecting amplitude variations of an amplitude modulated video carrier to produce a baseband video signal and another multiplier for synchronously detecting frequency variations of the video carrier to produce an analog AFT signal, the multiplier of the invention comprises the multiplier of the IC. In this way the tuned circuit for deriving the carrier for the synchronous detection operation of the video detector portion also serves to inhibit dropouts due to overmodulation.

These and other aspects of the invention will be explained with reference to the accompanying drawing in which.

Figure 1:
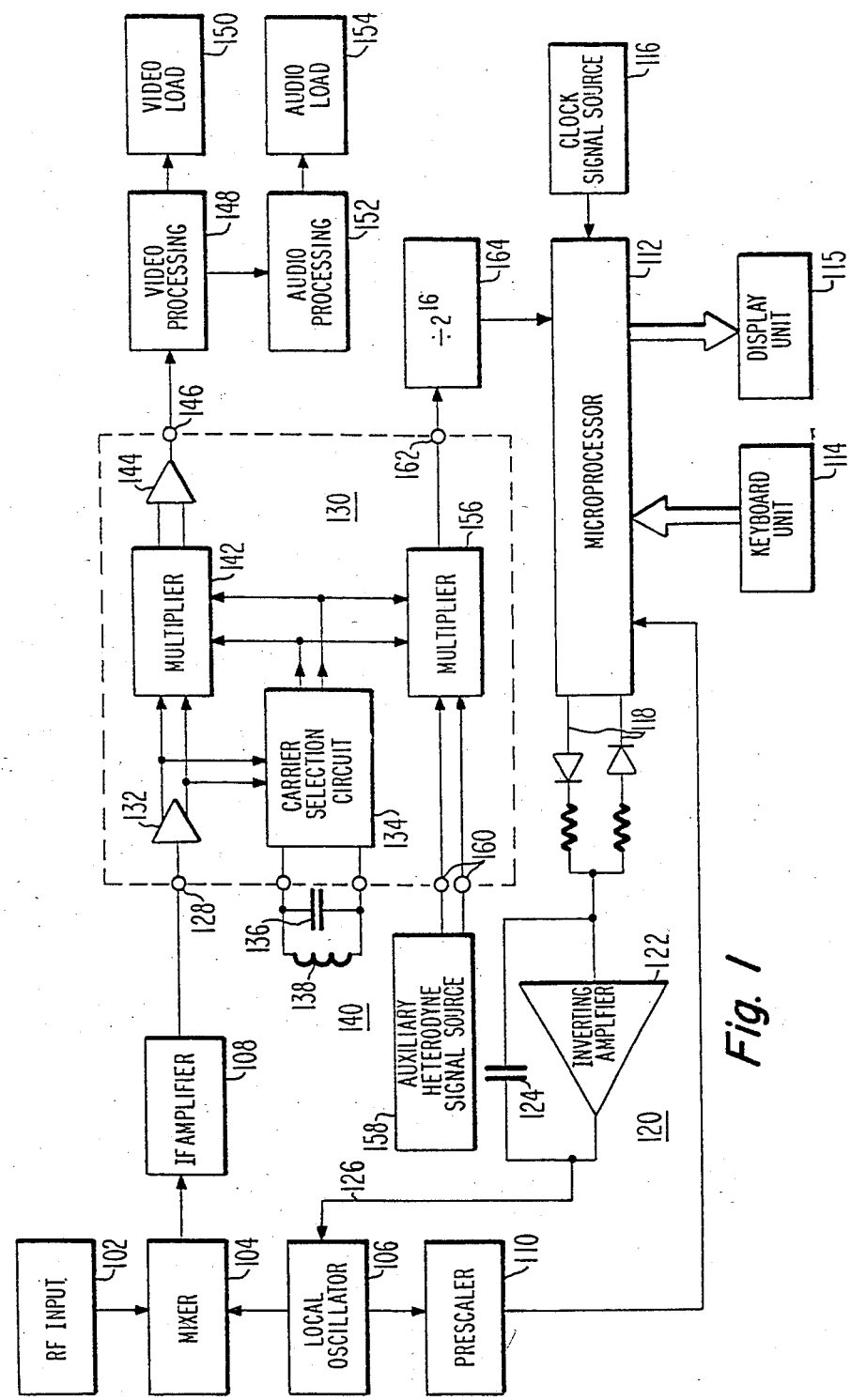
FIG. 1 shows partly in block diagram form and partly in circuit schematic form a television receiver including a preferred embodiment of the present invention.

Multiple signal paths are indicated in FIG. 1 by broad line strips between blocks.

In the television receiver of FIG. 1, a radio frequency (RF) input source 102 applies an RF signal to a mixer 104 in which it is combined with a local oscillator signal produced by a local oscillator 106 to produce an IF signal which is applied to the input of an IF amplifier 108. The local oscillator signal is also applied to a prescaler 110 which divides its frequency by a predetermined factor so as to produce a signal having a divided down frequency which is within the operating range of a microprocessor. The divided down frequency signal is applied to a microprocessor 112. In a channel selection mode of operation, microprocessor 112 is programmed to respond to the divided down frequency signal from prescaler 110, channel selection signals from a keyboard unit 114 and a clock signal from a clock signal source 116 to apply control signals by way of connections 118 to an integrator 120 which includes an operational amplifier 122 and a feedback integrating capacitor 124. The output of integrator 120 is applied, by way of a connection 126 to a control input of local oscillator 106 which is thereby controlled to produce an appropriate local oscillator frequency such that an IF signal of substantially correct IF frequency will be produced by an RF input signal having the correct channel frequency corresponding to the keyboard entry. In certain cases, such as in cable television and community antenna distribution systems, the carrier frequency may be offset from the standard frequency and AFT control will then be required. Microprocessor 112 also drives a display unit 115 which provides a display indication corresponding with tuning operations. The above described channel selection apparatus is conventional and, for example, may be implemented using a Fujitsu 8841 or a MAA 2000 central control unit microcomputer, including a phase locked loop for channel selection, as is available for use with the ITT Digit 2000 VLSI Digital TV System as described in the ITT data publication entitled "DIGIT 2000 VLSI Digital TV System".

The output of IF amplifier 108 is applied to an interface terminal 128 of an integrated circuit (IC) 130, which is coupled to the input of a buffer amplifier 132. While the preferred embodiment of the present invention being described is shown in FIG. 1 with buffer amplifier 132 and other functional circuit elements embodied in an integrated circuit, it is clearly not essential to the invention that these be embodied in an integrated circuit. It is, however, very convenient and it results in an efficient arrangement which is also very economical, as will be further explained later.

The output of buffer amplifier 132 is applied to a carrier selection circuit 134 which includes a tuned circuit 140 comprising capacitor 136 and inductor 138. The resonant frequency of the tuned circuit is selected to be that of the dominant carrier frequency in the IF signal such as, for example, the picture carrier frequency in the IF signal of a television receiver. The IF signal applied to carrier selection circuit 134 is filtered by resonant circuit 140 which is arranged to exhibit a relatively high quality factor (Q) so as to substantially reject close sideband frequencies above and below the carrier frequency, while passing the carrier signal frequency. The carrier frequency signal determines the output signal frequency of carrier selection circuit 134. The output of carrier selection circuit 134 is applied in differential form to a multiplier 142 which is also conveniently included in IC 130. The IF signal output of buffer amplifier 132 is applied in differential form to the other input of multiplier 142. Multiplication in multiplier 142 of the IF signal by the output signal of carrier selection circuit 134 results in synchronous product detection of the IF signal and produces the baseband video signal, which is appropriately processed by a buffer unit 144 having an output connected to an IC interface terminal 146. From terminal 146, the baseband video signal is applied to a video processing unit 148 which drives a video load 150 including e.g., an image reproducing display device. Video processing unit 148 also supplies an audio information bearing signal to an audio processing unit 152 which drives an audio load 154 including e.g., a loudspeaker.

The output signal of carrier selection circuit 134 is also applied to a multiplier 156 which is conveniently included in the same IC as multiplier 142. The other input to multiplier 156 is coupled by way of interface terminals 160 to an auxiliary heterodyne signal source 158. The frequency of the auxiliary heterodyne signal applied to multiplier 156 by auxiliary heterodyne signal source 158 is arranged to remain substantially constant and is selected to differ from the IF carrier frequency, preferably by a relatively small difference (e.g. 5 MHz) compared with the IF carrier frequency (e.g., 45.75 MHz for the NTSC picture carrier). The resulting difference signal produced by multiplier 156 is applied by way of an interface terminal 162 to the input of a frequency divider 164, which is arranged to divide it by a predetermined factor ($2^{16}=65,536$) down to a frequency which is within the operating range of microprocessor 112. It will be noted that in the present example, the input signal to frequency divider 164 is at 5 MHz, which is low enough not to require the expensive prescaler required for frequency division directly from IF. The output signal of divider 164 is applied to an input of microprocessor 112. Naturally, auxiliary heterodyne source 158 need not always be a separate signal generator, since in some cases, the receiver will include a stable frequency source required for another purpose from which the auxiliary heterodyne signal may be conveniently derived.

In an AFT mode of operation, microprocessor 112 measures the period of the signal applied to it from divider 164 and compares it with a measurement interval derived from the clock signal provided by clock signal source 116. Microprocessor 112 then applies correction signals by way of connections 118 and integrator 120 to control local oscillator 106, such that the period of the the output signal of divider 164 corresponds to the measurement interval. The local oscillator signal is thereby controlled to bring the resulting IF carrier more closely into correspondence with its normal correct value, thus providing AFT correction.

It will be noted that the output of carrier selection circuit 134 is conveniently and economically utilized concurrently for each of multipliers 142 and 156. Tuned circuit 140 preferably exhibits a high Q so as to provide a well-filtered carrier representative signal for synchronous demodulation of the video signal by multiplier 142. Such narrow-band filtering of the carrier, however, also serves in providing an appropriately filtered carrier representative signal to multiplier 156 for deriving an AFT signal. Because of the narrow-band filtering, the carrier representative signal input to multiplier 156 is relatively immune from the effects of IF signal loss due to over-modulation or impulse noise. The energy storage properties of high Q, narrow band resonant circuit 140 ensure a relatively uninterrupted carrier representative signal being applied to multiplier 156, so that the resulting difference frequency at terminal 162 provides an input signal of sustained level to divider 164, making the digital AFT function relatively immune to over-modulation effects and impulse noise.

As previously explained, the frequency of the auxiliary heterodyne signal is selected to differ from the IF carrier frequency, preferably by relatively small difference compared with the IF carrier frequency. This results in increased frequency sensitivity of the AFT control signal to tuning errors compared with an AFT system which is responsive directly to the IF carrier signal. This may be illustrated by the following example. Assume that there is a tuning error of 5 kHz. The IF frequency will then be 45.75 MHz plus or minus 5 kHz, which corresponds to a 0.01 percent error. Now assume that the auxiliary heterodyne signal produced by source 158 is at 50.75 MHz, so as to produce a signal at terminal 162 having a difference frequency of 5 MHz when there is no tuning error. Due to the tuning error, however, the difference frequency of the signal at terminal 162 will be 5 MHz plus or minus 5 kHz, which represents a 0.1 percent error. The relative error is therefore ten times as great with heterodyning. Such improvement in sensitivity is important in digitally processing the signal. It is noted that in the example used, the 5 MHz frequency selected is high enough to be out of range of the signals used in typical video processing circuitry and would thus produce no interfering beats.

Figure 2:
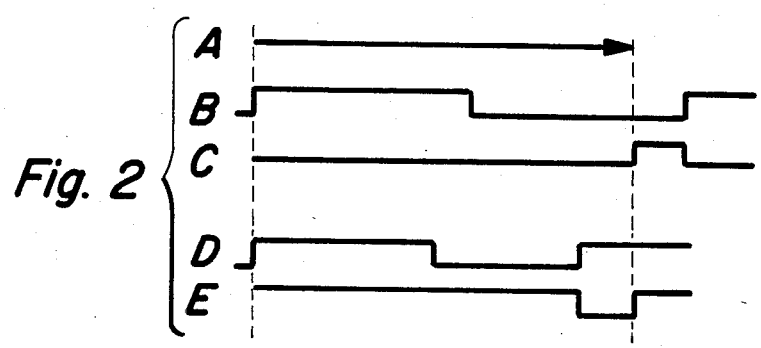
FIG. 2 shows a graphical representation of signals useful in understanding the preferred embodiment shown in FIG. 1 and the flow chart shown in FIG. 3.
Figure 3:
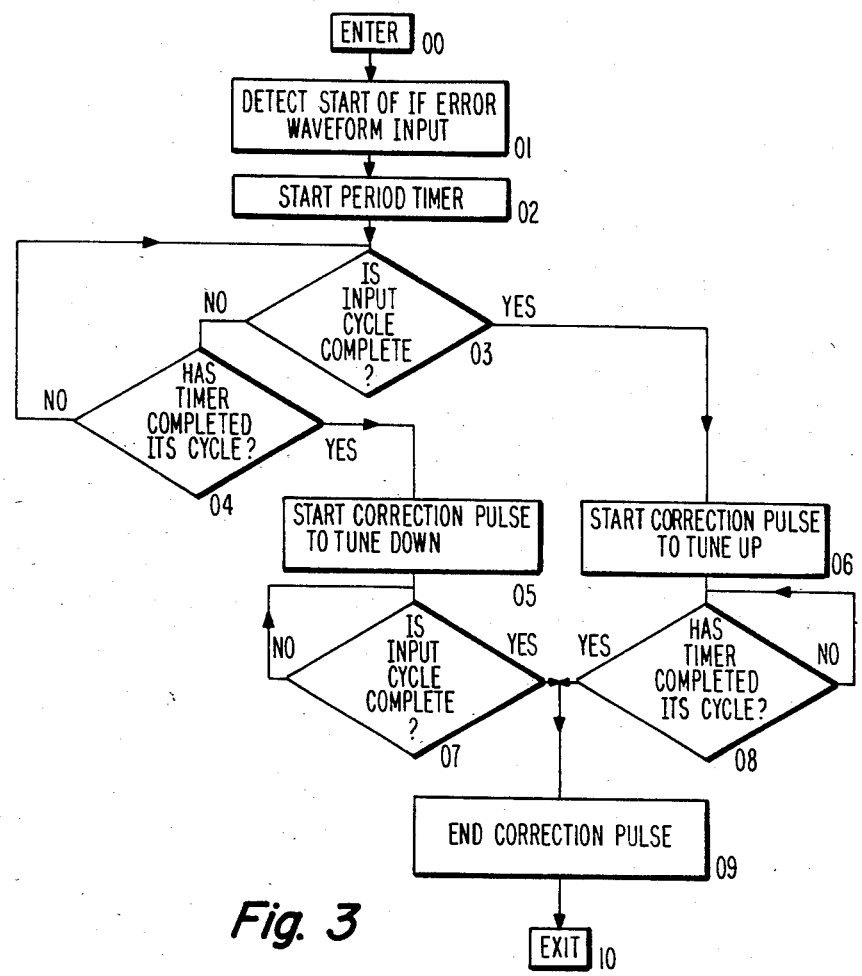
FIG. 3 is a flow chart of the operation of the AFT system shown in FIG. 1.

A suitable flow chart for microprocessor operation is shown in FIG. 3. Following the entry step designated as 00 in the flow chart, the start of a period of the signal applied to microprocessor 112 from divider 164 (referred to in the flow chart as the "IF error waveform") is detected in the process step corresponding to flow chart step 01. Once the period start is detected, a timing period or measurement interval is started, as indicated in step 02. The timing period is derived from the clock signal provided by clock signal source 116. Depending on which one of the IF error waveform period and the timing period is first completed, a timing correction signal pulse will start in accordance with step 05 or step 06. The correction pulse will continue until the other of the IF error waveform period and the timing period ends, whereupon the correction pulse will end. The representation of the timing relationships shown in FIG. 2 provides a graphical illustration of the process. Waveforms corresponding to low and high tuning errors are shown in FIG. 2 in which A indicates the correct error waveform period. Assuming that the auxiliary heterodyne signal is at a higher frequency than the IF, waveform B shows the error waveform when the tuning error is in the high direction, i.e., the difference frequency is too low. Waveform C shows the corresponding "tune down" correction signal which results. Waveform D shows the error waveform for a low tuning error, i.e., the difference frequency at terminal 162 is too high and waveform E shows the resulting "tune up" correction signal.

Figure 4:
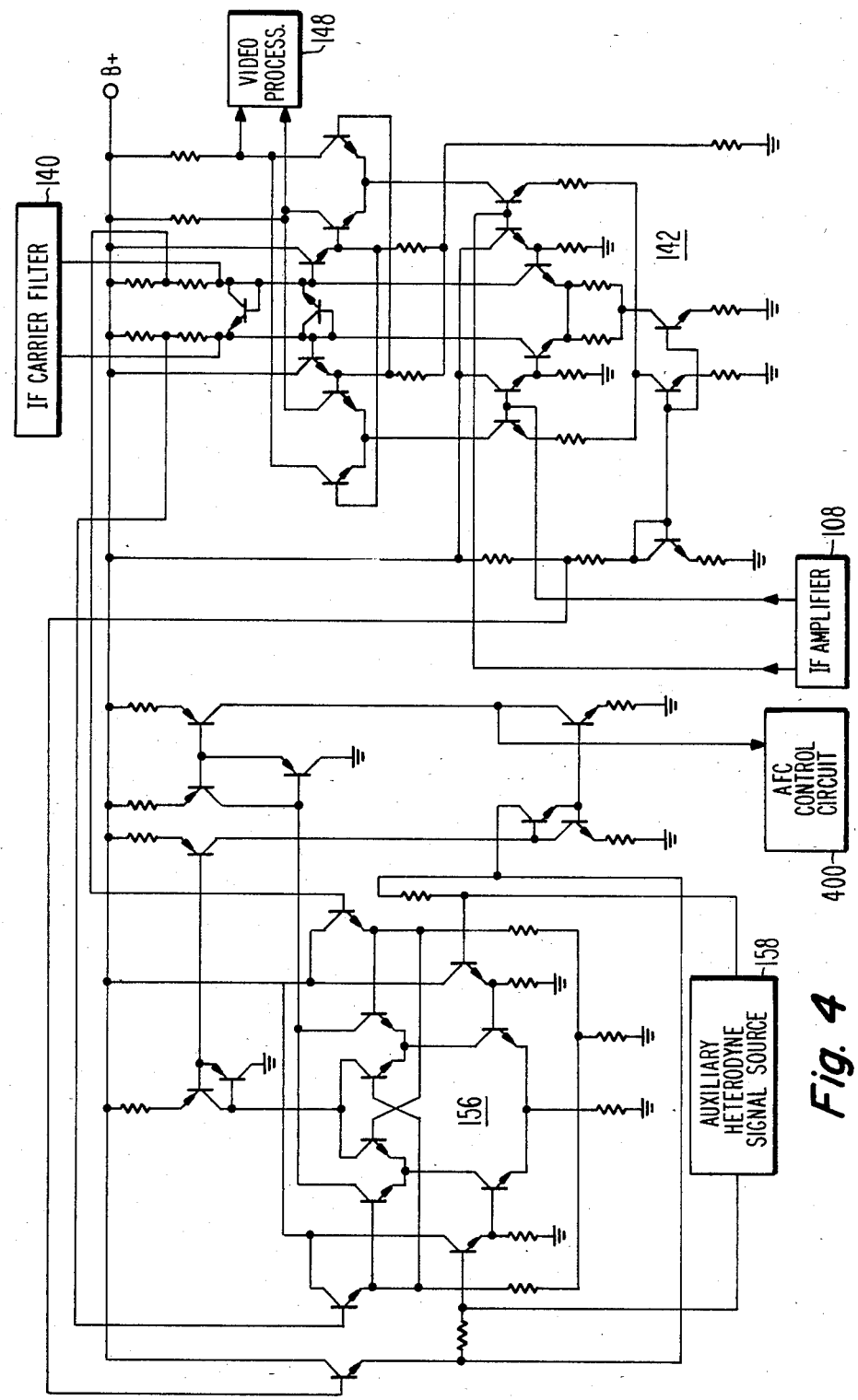
FIG. 4 shows a schematic diagram of an implementation of a portion of the preferred embodiment shown in block form in FIG. 1.

In the simplified schematic diagram shown in FIG. 4, 142 is a multiplier functioning as a synchronous detector which receives an IF signal from IF amplifier 108 and combines this signal with a filtered carrier representative signal derived by an IF carrier filter 140 to supply a video signal to a video processing unit 148. The circuit portion generally indicated as 156 corresponds to multiplier 156 in FIG. 1 and receives a carrier representative signal from IF carrier filter 140 for multiplication with a signal from auxiliary heterodyne signal source 158. The difference frequency signal produced is supplied to AFC control circuit 400. The circuits shown for multipliers 142 and 156 are conveniently incorporated in a single integrated circuit Type No. TDA2541, supplied by Philips Components and Materials.

Clearly, the implementation of the invention in accordance with the described preferred embodiment is illustrative and modifications are comtemplated to be within the scope of the present invention as defined by the following claims.

What is claimed is:

1. Apparatus for fine tuning a superheterodyne receiver for receiving a radio frequency (RF) signal, said receiver including controllable local oscillator (LO) means for producing a local oscillator signal and having a control input; mixer means for mixing said local oscillator signal and said RF signal for providing an intermediate frequency (IF) signal; IF amplifier means for processing said IF signal; and automatic fine tuning (AFT) control means for automatically controlling said LO means so as to reduce a frequency deviation between said IF frequency and a predetermined nominal IF frequency, said automatic fine tuning control means comprising:
   auxiliary heterodyne oscillator means for providing a heterodyning signal;
   carrier selective filter means coupled to said IF amplifier means for deriving a carrier representative signal at the IF carrier frequency;
   signal multiplier means coupled to said heterodyne oscillator means and said carrier selective filter means for producing an offset frequency signal proportional to a difference in frequency between said carrier representative signal and said auxiliary heterodyning signal;
   a source of a clock signal; and
   control means coupled to said signal multiplier means for receiving said offset frequency signal and to said source of a clock signal for receiving said clock signal for applying a control signal representative of said difference frequency to said controllable LO means control input in a sense to reduce said frequency deviation.

2. The apparatus recited in claim 1 wherein said carrier selective filter means comprises narrow band filter means for exhibiting relatively low attenuation at said IF carrier frequency and relatively high attenuation at sideband frequencies of said IF signal.

3. The apparatus recited in claim 2 wherein the frequency of said auxiliary heterodyning signal is substantially greater than said difference frequency.

4. Apparatus for fine tuning a superheterodyne receiver for receiving a modulated carrier radio frequency (RF) signal, said receiver including tunable local oscillator (LO) means for producing a local oscillator signal and having a control input; mixer means for combining said RF and LO signals so as to produce an intermediate frequency (IF) signal; carrier filter means coupled to said mixer means for deriving a carrier representative signal at the carrier frequency of said IF signal; first signal multiplier means coupled to said carrier filter means and to said mixer means for detecting the amplitude modulation of said IF signal signal to produce a baseband video signal; and automatic fine tuning (AFT) control means for automatically controlling said LO means so as to reduce a frequency deviation between said carrier frequency of said IF signal and a predetermined nominal IF frequency, said automatic fine tuning control means comprising:
   auxiliary heterodyne oscillator means for providing an auxiliary heterodyning signal;
   second signal multiplier means coupled to said heterodyne oscillator means and to said carrier filter means for producing an offset frequency signal proportional to a difference in frequency between said carrier representative signal and said auxiliary heterodyning signal;
   a source of clock signal; and
   control means coupled to said second multiplier means for receiving said offset frequency signal and to said source of a clock signal for receiving said clock signal for applying a control signal representative of said frequency deviation to said controllable LO means in a sense to reduce said frequency deviation.

5. The apparatus of claim 4 wherein said control means comprises microprocessor means for generating an output signal representative of said frequency deviation and signal integrating means coupled between said microprocessor means and said LO means control input for integrating said output signal and thereby producing said control signal representative of said frequency deviation.

6. The apparatus of claim 5 wherein said first and second signal multiplier means are incorporated in a single integrated circuit.

7. Apparatus for fine tuning a superheterodyne receiver for receiving a modulated carrier radio frequency (RF) signal, comprising:
   tunable local oscillator (LO) means for producing a local oscillator signal and having a control input;
   mixer means for combining said RF and LO signals so as to produce an intermediate frequency (IF) signal;
   automatic fine tuning (AFT) control means for automatically controlling said LO means so as to reduce a frequency deviation between said carrier frequency of said IF signal and a predetermined nominal IF frequency;
   carrier filter means coupled to said mixer means for deriving a carrier representative signal at the carrier frequency of said IF signal;
   first signal multiplier means coupled to said carrier filter means and to said mixer means for detecting the amplitude modulation of said IF signal to produce a baseband video signal;

auxiliary heterodyne oscillator means for providing a heterodyning signal;

second signal multiplier means coupled to said heterodyne oscillator and said carrier filter means for producing an offset frequency signal having an offset frequency proportional to a difference in frequency between said carrier representative signal and said heterodyning signal, wherein said first and second multiplier means are incorporated in a single integrated circuit; and wherein said automatic fine tuning control means includes a source of clock signal; and control means coupled to receive said offset frequency signal and said clock signal for applying a control signal representative of said frequency deviation to said controllable LO means in a sense to reduce said frequency deviation.

* * * * *